United States Patent [19]

Jenkin

[11] Patent Number: 4,606,941
[45] Date of Patent: Aug. 19, 1986

[54] DEPOSITION METALIZING BULK MATERIAL BY CHEMICAL VAPOR

[76] Inventor: William C. Jenkin, 382 Dorchester Rd., Akron, Ohio 44320

[21] Appl. No.: 515,699

[22] Filed: Jul. 21, 1983

[51] Int. Cl.$^4$ .................. B05B 17/00; B05C 5/00; B05D 7/00; C23C 16/00
[52] U.S. Cl. .................... 427/217; 118/303; 118/716; 427/242; 427/250
[58] Field of Search ............... 118/303, 716; 427/217, 427/242, 250

[56] References Cited

U.S. PATENT DOCUMENTS

| | | | |
|---|---|---|---|
| 2,990,807 | 7/1961 | Gerow | 118/716 |
| 3,213,827 | 10/1965 | Jenkin | 118/49.5 |
| 3,632,401 | 1/1972 | Sanlaville | 75/212 X |
| 3,839,077 | 10/1974 | Robinson | 118/716 X |
| 4,353,938 | 10/1982 | Sterling et al. | 427/217 X |

FOREIGN PATENT DOCUMENTS 896600  5/1962  United Kingdom .

OTHER PUBLICATIONS

Moorfeed Corp., Bulletin E.

Primary Examiner—Michael R. Lusignan
Attorney, Agent, or Firm—Oldham, Oldham & Weber Co.

[57] ABSTRACT

The invention is a procedure and apparatus for coating the individual particles of solid bulk materials, which may be particulate products or multiple small objects, by chemical vapor deposition. The particles or small articles are vigorously agitated and moved along the length of a vibrating, bottom heated, enclosed trough with lesser heated side walls, while the uppermost layer of the moving materials is exposed to the vapor of a volatile heat-decomposable or heat-reactable coating compound.

8 Claims, 13 Drawing Figures

DEPOSITION METALIZING BULK MATERIAL BY CHEMICAL VAPOR

SUMMARY OF THE INVENTION

This invention is a process and apparatus useful for metal coating of particles of granular or powdered materials, or very small shaped objects, by decomposition of a volatile compound of the metal in an enclosed apparatus.

The apparatus includes a known type of straight or circular oscillating trough, moving a short distance in a straight line or in an arc of a circle, rising in one direction and falling in returning, so that granular material in the trough moves progressively in the direction of the rising motion, and moves not at all during the falling motion during the return.

The floor of the trough is heated, and is also preferably inclined at a small angle, with repeated downward steps in a straight apparatus, or repeated trips over the same step in a circular apparatus, so that the granular material is moved progressively up the incline and repeatedly cascades to the beginning of the succeeding incline, for mixing the material, and for preventing the granules from becoming cemented together while they are being coated.

Heat is supplied to the bottom of the trough, at an adjusted rate, and vapors of a volatile compound of a metal are supplied above the contents of the trough, at such a rate that the heavy vapors of the metal compound sink part way into the granular material, where the heat decomposes the metal compound and deposits a metal coat on the granular material.

By proper adjustment of the temperature gradient in the load of granular material in the trough, most of the metal is deposited on the particles, foming a uniform metal coating.

PRIOR ART

It has been known for a great many years that fine powders could be coated with metals by heating the powders while suspended in a decomposable vapor of a volatile compound of a metal, by a "fluidized bed" technique. (J. E. Cline and John Wulff, J. Electrochem. Soc., 98(10), 1951, pp. 385-7; and the book "Vapor Deposition" by Powell, Oxley, and Blocher Jr., John Wiley and Sons, 1966, pp. 510-511.)

British Pat. No. 896,600 disclosed some of the conditions for gas plating, but does not present any economically feasible equipment or procedure for carrying out such an operation.

In my prior U.S. Pat. No. 3,213,827, issued Oct. 26, 1965, I described "gas plating" or chemical vapor deposition by decomposition of a gas or vapor to deposit a component of it on particles of granular material in a continuous process while the granules are kept in motion to prevent them from being cemented by the deposited material.

Several kinds of apparatus were described in that patent, including rotating horizontal drums containing the granular material, and in FIGS. 8 and 9 a previously known type of conveyor for granular material or small objects, including an oscillating trough which moves slowly in the direction of feed and rapidly in the reverse direction, with heat supplied by radiation from above, to decompose the metal-containing gas.

Those kinds of apparatus did not achieve as uniform deposition as was desired, nor an efficient utilization of the decomposable vapors, because much of the vapor reagent was decomposed by contact with the heated equipment rather than by deposition on the granular material, so that much expense was involved in waste of material and in removal of metal uselessly deposited on the equipment. Consequently, there has been no practical use of any previously known apparatus or procedure.

THE PURPOSE

The invention is useful not only for coating of granules such as are used to support metal catalysts, but also for metal coating of multitudes of small objects which can be handled as a single layer of a thickness which may be several times the maximum dimension of a single object such as a small fastener, for provision of a corrosion-resistant or attractive surface.

THE INVENTION

The invention consists in maintaining the objects or particles which are to be coated in constant relative or repetitive motion by mechanical means while heating from one direction and supplying the coating material from the other direction. Preferably the heat is supplied from below and the coating material is supplied from above.

With that arrangement, and with proper adjustment of conditions, deposition of metal from a volatile compound of the metal occurs primarily or only in the top and middle of the layer of objects or particles where the proper temperature exists along with a sufficient quantity of the decomposable metal compound.

To obtain this result the layer of material to be metalized should have a depth at least several times the largest dimension of any particle, and should be constantly agitated while supported on a heated surface; and a heat decomposable vapor of a metal compound should be supplied from above.

The consequence is that the heavy vapor sinks into the layer of material to be coated, until it encounters particles hot enough to decompose the vapor and deposit a layer of metal on the hot particles.

By adjustment of time of exposure, flow of the metallic vapor, and temperature, the thickness of the metal deposit can be regulated.

The side walls of the metallizing chamber should not be heated sufficiently to cause significant deposition of metal, and should be made thin, so that little heat will be transmitted along the side walls to cause unwanted metal deposition.

The flow of granular material in a trough is easily produced by rapid oscillation of the supporting surface, rising in one direction, and falling in the reverse direction to propel the material in the direction of travel.

The coating operation can be either a batch or a continuous treatment. Batches are advantageously treated in a circular trough, in which the material is circulated round and round; while large volumes are best treated in a linear trough or succession of linear troughs, long enough for completion of the desired thickness of coating in a single passage.

In either the recirculating procedure for coating one batch at a time, or in the continuous operation in which the material is completely coated while passing along a long trough from an entrance point to an exit, the trough is preferably tilted slightly upwardly in the direction of progress of the work, with the floor of the trough interrupted by a vertical drop in at least one location of a batch apparatus, and in many locations of a continuous once-through apparatus. The load of work pieces (granules or shaped objects) is thus mixed repeatedly so that all individual pieces will receive essentially the same treatment.

THE DRAWINGS

DETAILED DESCRIPTION

In this invention, the granular material, which is to be coated, is supported on an oscillating surface or bed which vibrates in a particular manner causing the granular material to flow in one direction. The bed in a preferred embodiment is circular in plan, and is made with a helically inclined surface or surfaces connected by a vertical step or steps. In a modification for coating large volumes of material, the bed is straight and is long enough for completion of the coating operation in a single pass through the machine.

In either the batch process or the continuous process, the oscillation of the bed is carried out in a particular manner which causes the granular material to move in one direction, by rising of the bed when it oscillates in that direction and falling of the bed as it oscillates.

Consequently, the granules, or other objects to be coated, are constantly agitated, and in particular are mixed as they flow over each of the steps in the trough, so that each article or particle can acquire a uniform coating over its entire surface, and also uniform from one article or particle to the others.

BATCH OPERATIONS

Figure 1:
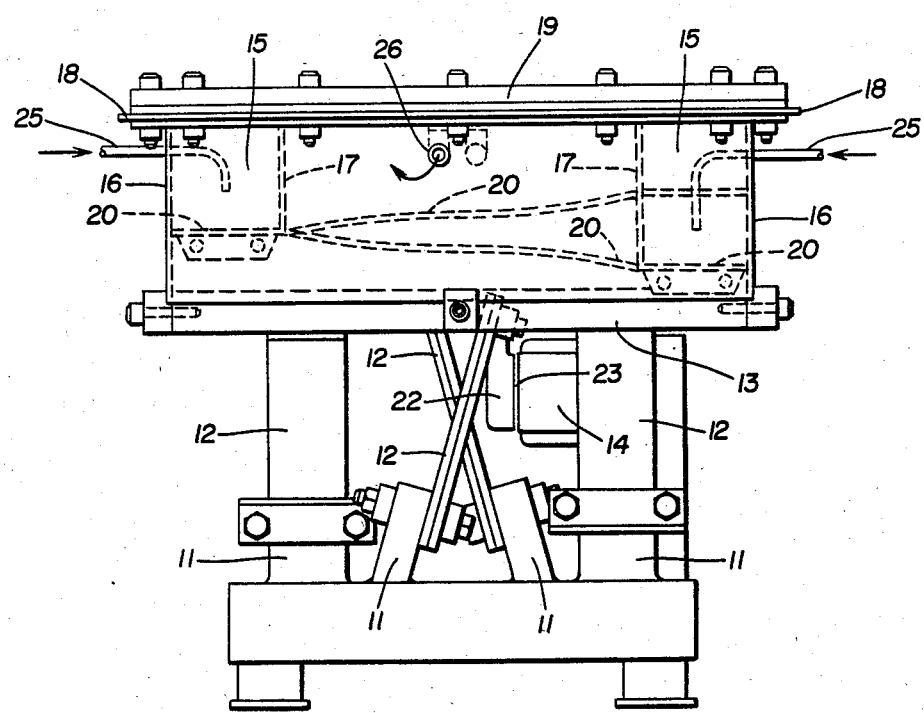
FIG. 1 is a side view of a preferred form of the apparatus of this invention.
Figure 2:
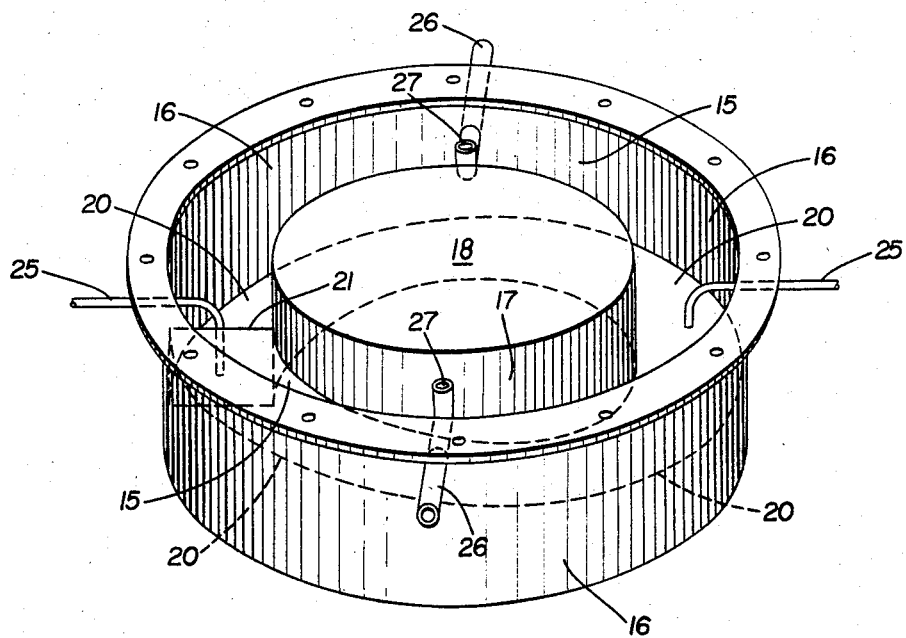
FIG. 2 is an oblique downward view of the bowl of FIG. 1, looking across the top with the cover removed.
Figure 3:
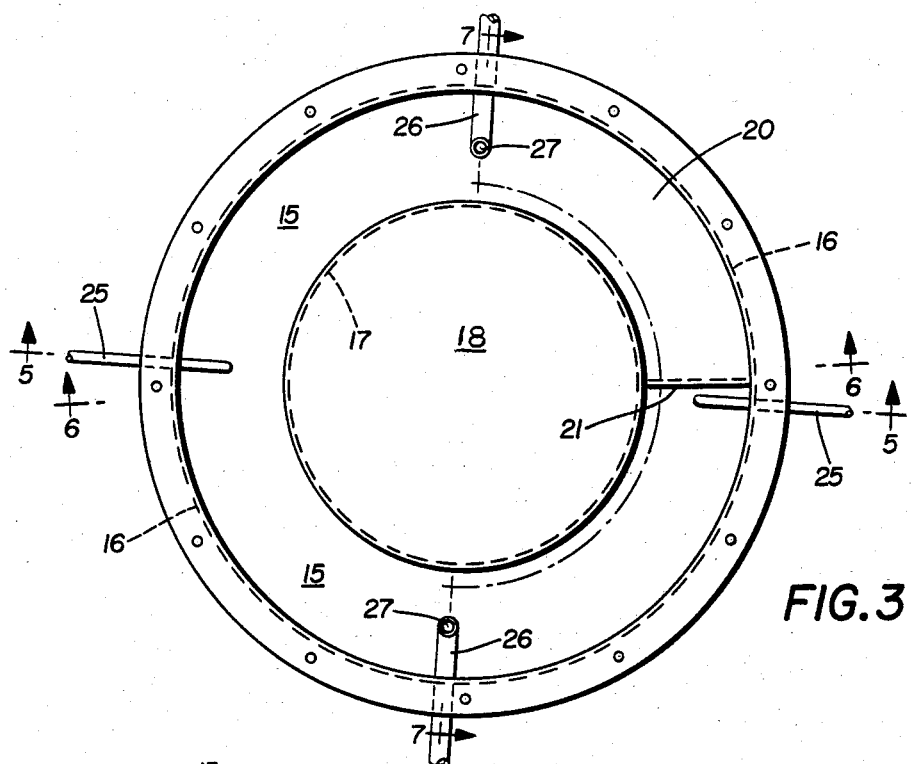
FIG. 3 is a vertical top view with the cover removed.
Figure 4:
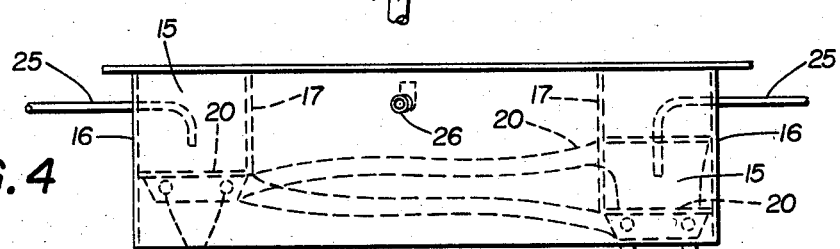
FIG. 4 is a "phantom" side view, showing the location of heating elements.
Figure 5:
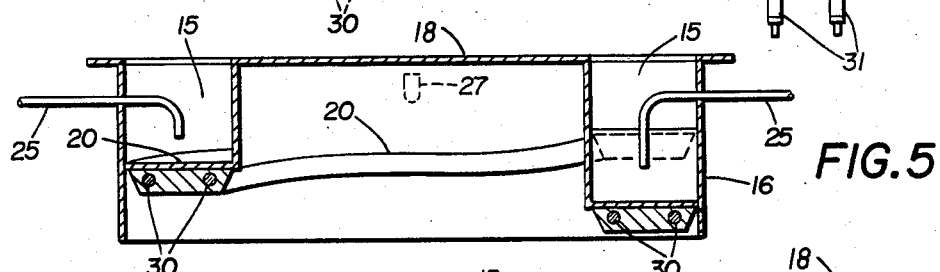
FIG. 5 is a sectional view, showing the lowest point of the circular trough.
Figure 6:
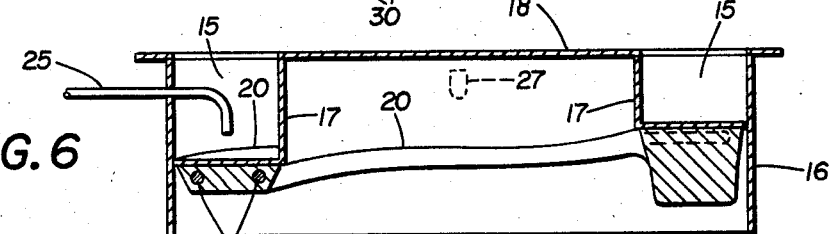
FIG. 6 is a sectional view at a slightly different angle from FIG. 5, showing the highest point of the circular trough.
Figure 7:
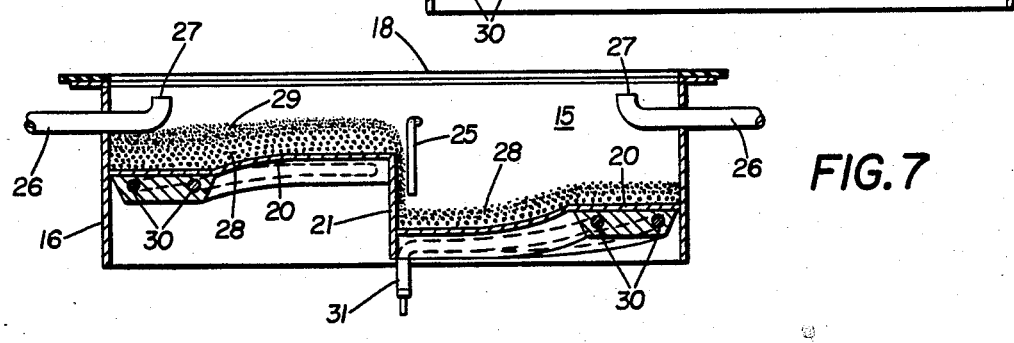
FIG. 7 is a section at about a right angle to that of FIGS. 5 and 6, without the inner wall of the trough, showing the conduits for venting of spent vapors, and showing how the granular material being coated progresses around the circle and cascades over the step.

Referring to FIG. 1, the apparatus in a preferred embodiment includes a known supporting and activating combination of a fixed square or circular base having four upstanding lugs 11, somewhat inclined from the vertical, with the inclinations all in the same circular direction around the base. Each lug supports a stiff leaf spring 12 consisting of one, two, or more leaves extending upward at a small angle to the vertical.

The movable part of the apparatus includes a rigid support 13 which may have the shape of a circle or of a cross, the periphery of which is fastened to the upper ends of the leaf springs 12. This arrangement permits a strong force tangential to the support 13 to bend all of the leaf springs 12 by a small circumferential distance, while the width of the springs prevents any radial motion. The consequence is a circular oscillation through a small angle, at a high frequency, which may suitably be synchronous with the 60 cycles per second of the common alternating current electric supply, or twice that frequency, namely 120 per second.

The required tangential force is provided by a powerful electromagnet 14, which exerts its force at the chosen frequency to turn the support 13, together with any structure mounted on it, through a small angle, with the leaf springs 12 then returning the support to its previous position.

On this known mechanism is placed the novel part of this invention, consisting of a longitudinally vibrating trough 15, which can consist of the space between a clindrical outer wall 16 and a cylindrical inner wall 17. The circular space inside of the inner wall is empty and is desirably sealed by a cover 18 to prevent anything from falling through center. The top of the circular trough 15 is enclosed by a removable gas-tight lid 19 which preferably extends completely across the center, so as to avoid any need for supplying a seal at the inner wall 17 of the trough.

The base 20 of the trough has a helical slope of low pitch. The consequence is that the base of the trough is not a closed circle, but includes one or more steps or drop-offs 21, only one being shown in the drawings.

An important part of the invention is the provision of means for maintaining the base 20 of the trough at a temperature somewhat higher than the decomposition temperature of the metal compound which is used, so that the granules or objects to be coated will become heated to the decomposition temperature of the metal compound, and become metal coated, at a level somewhat above the bottom of the trough but below the surface of the layer of granules or objects in the trough.

Equally important is that the side walls 16 and 17 of the trough are thin and are unheated so that they do not become hot enough for decomposition of the metal compound, so that unwanted coating of the sidewlls does not occur.

In the specific example which will be given, for nickel coating of granules, nickel carbonyl is decomposed by heat, to deposit metallic nickel on the granules. The base 20 of the trough is accordingly heated to a temperature such that the deposition of the metal will occur somewhat above the base of the trough.

This condition is important for preventing waste of the metal compound and build up of metal deposits on the trough rather than only on the contents of the trough.

Since the process involves deposition of a metal from an easily decomposable compound of the metal in vapor form, the apparatus will generally include conduits such as the supply tubes 25 for introduction of the vapor of the metal compound. In the case of use of the apparatus for nickel coating of the granular material by decomposition of nickel carbonyl, the supply conduits 25 will normally terminate a small distance above the layer of granular material in the trough 15. Two such supply conduits are shown, but the number may be either smaller or larger, depending on the characteristics of the materials used in a particular situation.

In the case of deposition of nickel from nickel carbonyl, or of other metals from easily decomposable volatile metal compounds, there will normally be a gaseous residue which will need to be evacuated. Accordingly, one or more outlets 26 are normally supplied, preferably in the same number as the reagent inlets 25.

The decomposable volatile metal compounds, such as nikel carbonyl, have a high molecular weight and a consequent high density in gas form, and therefore will flow spontaneously downward in the trough where they will be in direct contact with the heated bed of granular material to be coated. On decomposition of the metal compound by heat, the non-metallic residue of the coating compound will normally be a relatively very light vapor or gas. In the case of nickel coating from nickel carbonyl, the residual gas will be carbon monoxide, which has only a small fraction of the molecular weight of nickel carbonyl and will therefore tend to rise spontaneously to the top of the vapor space immediately under the lid 19. Accordingly, the outlets 26 will normally have their open inner ends 27 immediately adjacent to the lid 19 so as to remove the residual carbon monoxide with minimal loss of the nickel carbonyl reagent.

Moreover, four molecules of carbon monoxide will be liberated from decomposition of each molecule of nickel carbonyl, so that the volume of gas removed is greater than the volume introduced, and the outlets 26 may be larger than the inlets 25.

Since heat will generally be the means for liberating the metal from a metal compound, the apparatus necessarily includes means for supplying heat in an appropriate manner and at an appropriate temperature. It is very important that the heat be so localized that the granular material will reach a suitable temperature for decomposition of the metal compound and deposit of the metal on the granules, but that the fixed metal parts of the apparatus itself will either not be exposed to the vapors of the metal compound or will not be heated sufficiently to cause deposition of the metal on the apparatus.

This desirable temperature relation is achieved by placing heating elements underneath the base of the trough 15 and heating the base 20 to a temperature somewhat above the decomposition temperature of the metal compound in order that a suitable depth of granular material in the trough will result in decomposition of all of the vaporized metal compound within the bed of granular material, with essentially none of the metal being released at or near the base of the trough. Adjustment of the rate of supply of the metal compound will assure that most is usefully decomposed for deposition on the surfaces of the work pieces with a minimum carried away in the exhaust gas. The thickness of coating will then depend on the time of treatment.

Other means for mixing the articles or particles while they are being coated can be employed if desired, such as movement of radial stirring arms around the trough with at least some of the arms being at or near the bottom of the trough.

CONTINUOUS OPERATION

Figure 8A:
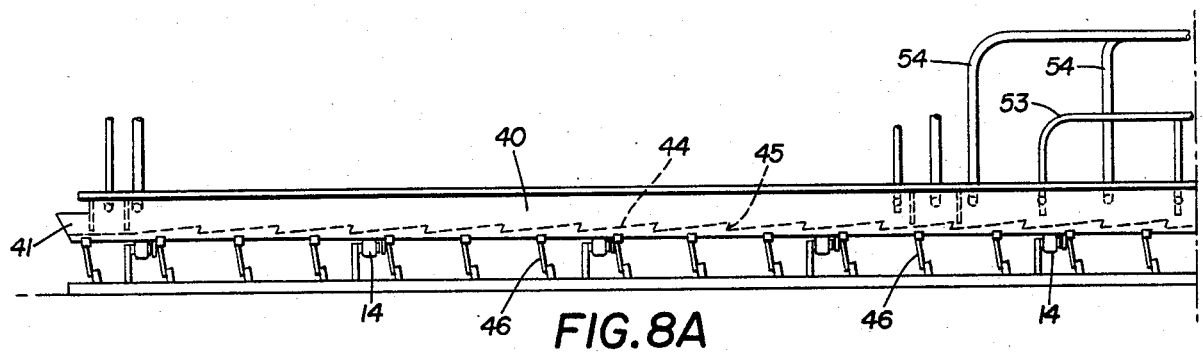
FIG. 8A, 8B is a side view of an apparatus for continuous gas plating of large volumes of small objects.
Figure 8B:
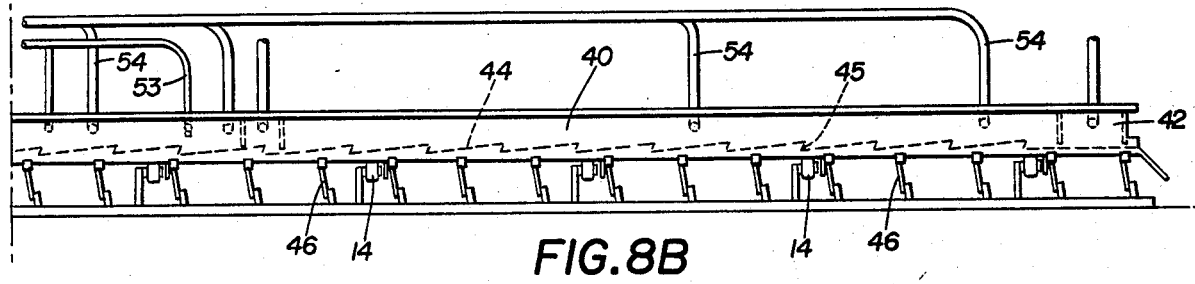
Figure 9:
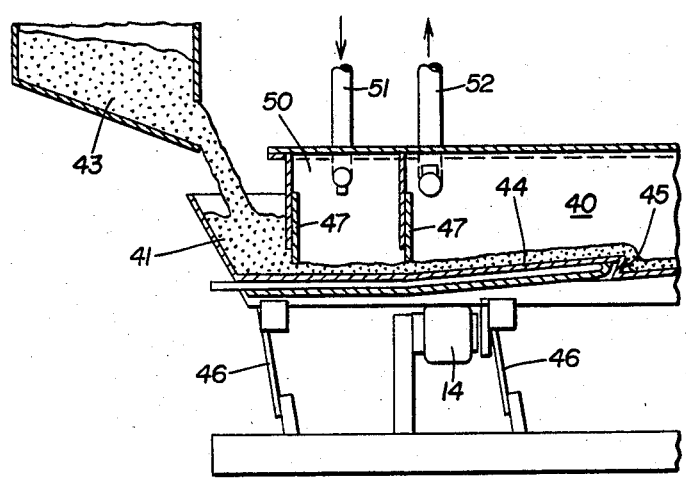
FIG. 9 is a larger scale view of the feed end of the apparatus of FIG. 8.
Figure 11:
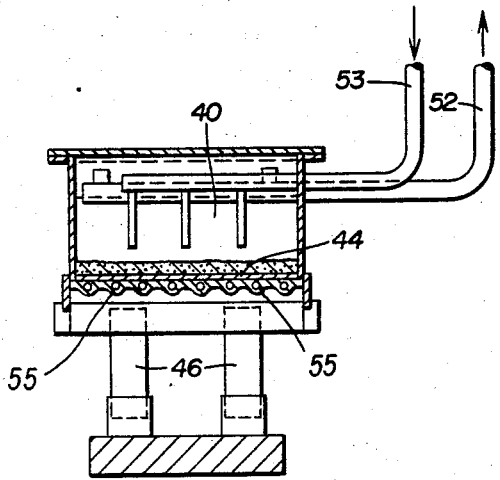
FIG. 11 is a sectional view of the apparatus of FIG. 8.
Figure 12:
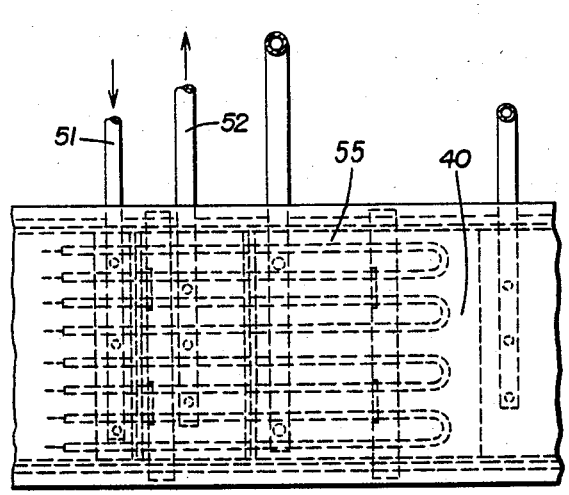
FIG. 12 shows the position of longitudinal heaters under a long straight trough.
Figure 10:
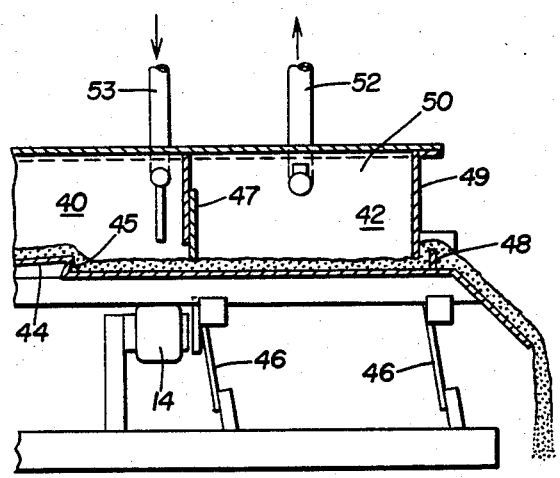
FIG. 10 is a larger scale view of the discharge end.

Referring now to FIG. 8, the drawing is divided so that FIG. 8A shows the inlet portion of a continuous coating apparatus and FIG. 8B shows the discharge portion. The details of the inlet end are shown on a larger scale in FIG. 9, and the details of the discharge end are shown in FIG. 10.

As in the batch apparatus described above, this embodiment includes a covered trough. In this case the trough 40 is straight, with a feed hopper 41 and a continuous discharge end 42. The hopper 41 may be fed continuously or intermittently from any desired source such as storage bin 43.

The apparatus needs to provide for travel and mixing of the work, just as in the case of the batch apparatus described above. A preferred type of equipment accordingly is an enclosed trough like that of FIGS. 1 to 7, except that it is straight and long, so that the metal coating is completed in a single passage through the apparatus.

This apparatus of FIG. 8 accordingly includes the long straight covered trough 40 with a bottom surface consisting of a multitude of gradual inclines 44 interrupted by drops 45, so tat the work cascades repeatedly over one after the other of the drops, for mixing of the load.

That action, as in the case of the circular trough, results from support of the trough on a plurality of leaf springs 46 which are inclined so that longitudinal motion of the trough 40 is at a slight angle to the horizontal, for rising motion toward the discharge 42 and a falling motion in the opposite direction, at a frequency of 60 or 120 vibrations per second, for inducing a flow of the supported material toward the discharge. Such vibrations are appropriately induced by a plurality of electromagnets of the kind previously described.

Appropriate means are provided for preventing escape of the metalizing gas, including, for instance, vertically adjustable partitions 47, of which a pair may be placed at the inlet end for reasonable assurance against loss of toxic gas, and one or two partitions at the exit end. A final seal at the exit end may consist of a low dam 48 to retard motion of the load sufficiently to back it up against the bottom of the final partition 49.

In addition, a neutral gas such as nitrogen may be introduced into airlock chambers 50 through a pressure supply 51 to displace air from the bulk material and to prevent flow of treatment gas toward the inlet; suction 52 is provided for removal of treatment gas from the interstices of the work load at the exit end, for safe disposal and its replacement by room air sucked in below the final partition 49.

This continuously operating apparatus for metal coating is provided with an appropriate number of gas inlets 53 for supply of the metalizing gas, and is provided with exhaust connections 54 for removal of the demetalized gas after the deposition of its metal component on the work pieces.

The metalizing gas can be any of the volatile metal compounds which are easily decomposed by heat, or which react to deposit a film of catalytically active metal, or decorative metal, or other desirable metal, and liberate the other component in gas or vapor form for elimination. Such heat-decomposable or reactable metal compounds include primarily metal halides or carbonyl compounds, or other volatile compounds of chromium, cobalt, copper, iron, or molybdenum.

By suitable adjustment of rate of delivery of product to be coated, and of rate of supply of metallizing gas, and also of heat to the bottom of the metalizing chamber by heating pipes or electric heaters 55, the metal content of the gas can be deposited on the surface of the material to be coated.

The decomposition temperatures of volatile metal compounds are well known, and the vapor of the chosen compound will be heated to at least its decomposition temperature by its contact with the hot material being coated, so as to deposit the chosen metal.

The choice of a convenient temperature and time are easily determined from the known properties of the articles being treated, and of the metal vapor used, such as nickel carbonyl for nickel plating, molybdenum hexafluoride for molybdenum plating, platinum trifluoro phosphine for platinum plating, etc.

The result of the use of this equipment is that the materials contained in the circular trough 15 move progressively around the trough, to reach the top of the step 21 and tumble over the step to the low point of the trough and continue this motion round and round with a tumble over the step 21 in each revolution of the contents of the trough.

The circualr trough 15 is entirely closed by a solid cover 19, except for entrances and exits so as to permit introduction and withdrawal of the gases for treating the material contained in the trough 15 while simultaneously excluding air. Preferably, two inlet ducts 25 and two outlet ducts 26 are provided in a circular apparatus of about 15 inches diameter. Larger apparatus may have more or larger inlets and outlets.

The machine is designed for coating of bulk materials in trough 15 by chemical vapor deposition. The particular metal or other coating deposited will depend on the vaporizable chemical compound selected. An example of a decomposition type chemical vapor deposition is the deposition of nickel by flowing vapors of nickel carbonyl (b.p. 43° C.) over the heated bulk material. At the heated surface of the treated material the nickel carbonyl decomposes and deposits metallic nickel, liberating the carbon monoxide gas which is eliminated through the outlet passages together with any undecomposed nickel carbonyl. Typical temperature for the heated floor of the trough is 150° C.

Low temperature chemical vapor deposition which can be performed in the apparatus as described herein, made of common type 304 stainless steel, includes such systems as depositing aluminum from aluminum triisobutyl; molybdenum from molybdenum hexacarbonyl; cobalt from cobalt nitrosyl carbonyl; iron from iron carbonyl.

If the apparatus is constructed from heat-resistant alloys, and the electromagnet is suitably protected or moved away from the heat, coatings can be applied which will resist high temperatures. Examples are deposition of tungsten from a mixture of tungsten hexafluoride and hydrogen; deposition of titanium boride from a mixture of titanium tetrachloride, boron trichloride and hydrogen; deposition of titanium carbide from a mixture of titanium tetrachloride, hydrogen and methane; among others. A high temperature setup may require some insulation on the side walls to prevent excessive cooling of the bulk material by contact with the wall of the container.

In this form of the invention, for batch operation, the circular trough 15 is loaded with a charge of bulk particles which are to be coated, and the cover 19 is fastened in place so that the trough 15 is completely enclosed except for the inlets 25 and outlets 26. The electromagnetic vibrator 14 is as already described.

The consequence is to cause continuous progression of the bulk material which is to be coated, in the upward direction of the sloping annular floor 20 of the trough, and continuous cascading of the material over the step 21 to the low point of the trough, and continuing circulatory motion round and round as long as the vibrator is operating.

Once the following conditions are properly chosen, for granules of a particular material; namely:

1. A chosen quantity to fill the trough to a satisfactory depth,
2. Heat supplied from below at a rate appropriate to the energy required for decomposition of the reagent gas and maintenance of the decomposition temperature, and
3. Supply of a decomposable metal compound at a limited rate such that essentially all of it will decompose before reaching the bottom of the trough, but little or no decomposition will occur on the side walls or in the free space above the granules;

Then the time of reaction will determine the thickness of the metal deposit.

Further modification of the apparatus and procedure may be found to improve performance in certain instances. Thus one or more deflecting baffles can be rigidly positioned in the moving bulk material to direct the material from side to side, or side to center, or center to side, to improve mixing and homogeneity of the coated charge.

When very fine powders are coated, they can be mixed with a coarse inert aggregate which moves and tumbles around during the coating operation and reduces or eliminates agglomeration of the fine powder. Since the surface area of a coarse aggregate can be two to three orders of magnitude smaller than that of a fine powder, the percent of coating incidentally formed on the coarse aggregate can be a minor factor and be economically tolerable. The coarse aggregate will assist in communicating the vibratory and horizontal motion to the fine powder and thus improve flow and movement.

I claim:

1. Apparatus for coating of multiple small objects with metal or a metal compound, said apparatus comprising:
   (a) an enclosed trough for containing said small objects, said trough comprising a stepped bottom and upwardly extending side walls, said bottom comprising at least one gradually inclined surface joined by at least one essentially vertical drop,
   (b) means for heating said bottom, said side walls being unheated;
   (c) means for oscillating said trough so that said small objects move progressively up said inclined surface and tumble over said vertical drop;
   (d) supply means for admitting a decomposable metal compound in gaseous form, and
   (e) outlet means for removing decomposition products.

2. An apparatus as in claim 1, in which the reciprocatory movement is provided by repeated magnetic attraction and release of an element of the apparatus.

3. An apparatus as in claim 2 in which the repeated magnetic attraction and release results from activation of an electromagnet by an alternating electric current supply.

4. An apparatus as in any of claims 1, 2 or 3 4 in which the container is annular, for batch operation.

5. An apparatus as in any of claims 1, 2 or 3 in which the trough is essentially linear, with means for continuous supply of articles at one end and means for removal of articles at the other end.

6. A process for coating multiple small objects with a metal, which comprises:
   (a) supporting said objects in an enclosed trough having a stepped bottom surface and upwardly extending side walls, said bottom comprising at least one gradually inclined surface joined by at least one essentially vertical drop;
   (b) oscillating said trough so as to progressively move said small objects up the inclined surface and allow said objects to tumble over the top edge thereof;
   (c) supplying a decomposable compound of said metal to said inclined surface from above;
   (d) heating said inclined surface from beneath said surface without heating said side walls, thereby heating said small objects thereon to a temperature above the decomposition temperature of said decomposable compound, and
   (e) removing gaseous decomposition products.

7. A process as in claim 6 in which the trough is circular and its oscillation causes repeated circulation of the objects around the trough and over the step.

8. A process as in claim 6 in which said trough is linear and includes a plurality of said inclined surfaces joined by a plurality of said drops, and in which reciprocation of said trough causes progressive movement of the objects from one end of the trough to the other in the direction in which said surfaces slope upwardly.

* * * * *